United States Patent [19]
Tamura et al.

[11] Patent Number: 4,733,134
[45] Date of Patent: Mar. 22, 1988

[54] LIQUID METAL ION SOURCE WITH PULSE GENERATOR CONTROL

[75] Inventors: Hifumi Tamura, Hachioji; Tohru Ishitani, Sayama; Kaoru Umemura; Yoshimi Kawanami, both of Kokubunji, all of Japan

[73] Assignee: Hitachi, Ltd., Tokyo, Japan

[21] Appl. No.: 865,976

[22] Filed: May 22, 1986

[30] Foreign Application Priority Data

May 24, 1985 [JP] Japan .................................. 60-110474

[51] Int. Cl.$^4$ .......................... H01J 7/24; H05B 31/26
[52] U.S. Cl. ........................... 315/111.81; 315/111.01; 315/363; 313/163; 313/362.1; 313/360.1; 313/167
[58] Field of Search ........... 315/111.81, 169.1, 111.31, 315/111.11, 363.1, 111.21; 313/163, 362.1, 360.1, 167

[56] References Cited

U.S. PATENT DOCUMENTS

| | | | |
|---|---|---|---|
| 4,344,019 | 8/1982 | Gavin et al. | 315/111.81 |
| 4,422,013 | 12/1983 | Turchi et al. | 315/111.81 |
| 4,453,078 | 6/1984 | Shimizu | 315/111.81 |
| 4,560,907 | 12/1985 | Tamura et al. | 315/111.81 |
| 4,624,833 | 11/1986 | Umemura et al. | 313/362.1 |
| 4,629,931 | 12/1986 | Clark, Jr. et al. | 313/362.1 |
| 4,631,448 | 12/1986 | Tamura et al. | 315/111.81 |

FOREIGN PATENT DOCUMENTS

| | | | |
|---|---|---|---|
| 0198824 | 11/1983 | Japan | 315/111.81 |
| 0198815 | 11/1983 | Japan | 315/111.81 |

*Primary Examiner*—David K. Moore
*Assistant Examiner*—Michael J. Nickerson
*Attorney, Agent, or Firm*—Antonelli, Terry & Wands

[57] ABSTRACT

A liquid metal ion source is disclosed, wherein it comprises an ion emitter tip, ion source material holder means holding ion source material for supplying liquid metal ion source material to said ion emitter tip, ion extracting means for extracting ions from said ion emitter tip, when a voltage is applied between the ion extracting means and the ion emitter tip, the pulsing means for pulsing the relative voltage applied between the ion extracting means and the ion emitter tip. A DC voltage corresponding to the threshold voltage $V_{th}$ for ion beam extraction is applied between the ion emitter tip and the extracting electrode, what permits to extract an ion beam having a high current density by superposing a pulsed voltage on the DC voltage.

5 Claims, 14 Drawing Figures

FIG. 1
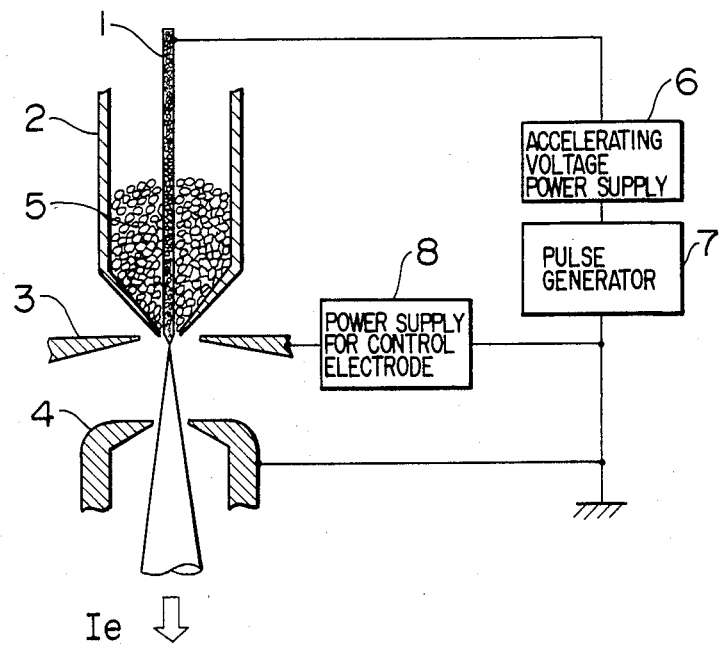
FIG. 2A
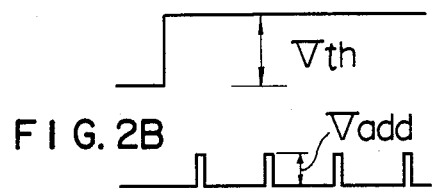
FIG. 2B
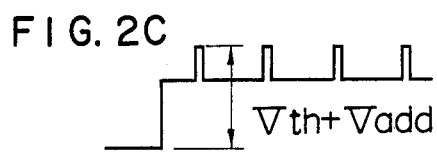
FIG. 2C
FIG. 3
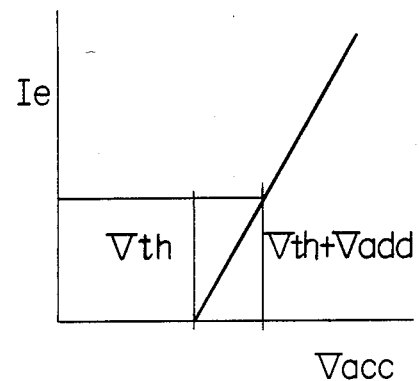

4,733,134

LIQUID METAL ION SOURCE WITH PULSE GENERATOR CONTROL

BACKGROUND OF THE INVENTION

This invention relates to a liquid metal ion source and in particular to a liquid metal ion source provided with a function to form a pulsed ion beam, suitable for ameliorating working speed and controllability in fabrication and for increasing analyzing sensitivity in analysis, when it is applied to microfabrication or microanalysis for the fabrication of semiconductor devices.

In a prior art liquid metal ion source, as described in Japanese Patent Unexamined Publication No. 58-32346, a DC voltage has been applied between the ion emitter tip and the extracting electrode as the ion extracting voltage and a DC ion beam has been utilized. That is, heretofore, with a liquid metal ion source no pulsed ion beam has been utilized. The difficulty to form a pulsed ion beam has been due to the fact that it is difficult to obtain pulsed voltage having a voltage of several kV as well as good rising and falling characteristics.

SUMMARY OF THE INVENTION

The object of this invention is to provide a liquid metal ion source permitting to avoid decrease of current density due to the space charge effect and to form a pulsed ion beam having a high density and a good controllability by making the liquid metal ion source work in a pulse operation.

According to this invention, in order to achieve the object stated above, the liquid metal ion source is so constructed that it comprises means for pulsing a relative potential applied between the ion emitter tip and the extracting electrode or the control electrode.

A liquid metal ion source has an intrinsic property that the ion extraction voltage has a threshold value and that beam current rises rapidly for the voltages higher than the threshold value. Utilizing this particular property, the principle of this invention consists in that at first a DC voltage, which is close to the threshold voltage, that is, corresponds to the threshold voltage, or a voltage slightly lower or slightly higher than the threshold voltage, is applied to the ion emitter tip so that the beam is cut off or a DC beam is continuously emitted, and further a pulsed voltage of same polarity is superposed on this voltage or a pulse voltage of same polarity is applied to the extracting electrode so that the beam is pulsed.

BRIEF DESCRIPTION OF THE DRAWINGS

FIG. 1 is a schematical cross-sectional view illustrating the construction of a liquid metal ion source according to an embodiment of this invention;

FIG. 2A is a scheme indicating a voltage waveform of the output of the accelerating voltage power supply;

FIG. 2B is a scheme indicating a voltage waveform of the output of the pulse generator;

FIG. 2C is a scheme indicating a waveform of the ion accelerating voltage;

FIG. 3 shows characteristics indicating the relation between the ion accelerating voltage Vacc and the intensity of the ion current Ie for the embodiment indicated in FIG. 1;

DESCRIPTION OF THE PREFERRED EMBODIMENTS

Figure 4:
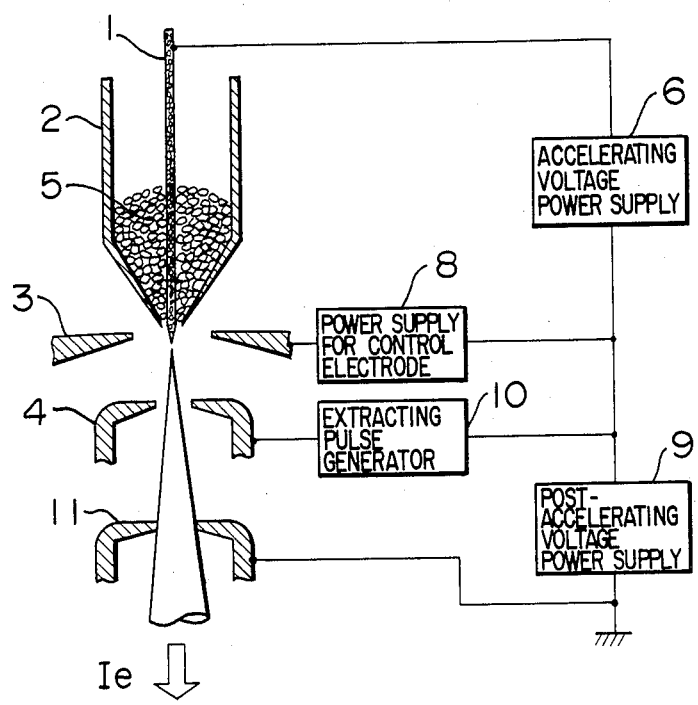
FIG. 4 is a schematical cross-sectional view illustrating the construction of a liquid metal ion source according to a second embodiment of this invention.

Hereinbelow some preferred embodiments of this invention will be explained, referring to the drawings.

The first embodiment, in which a pulsed voltage superposed on the high DC voltage itself applied on the emitter tip, will be explained, referring to FIG. 1. As indicated in FIG. 1, the liquid metal ion source according to this embodiment consists of an ion emitter tip 1, a reservoir 2 for the ion source material, a control electrode 3, an extracting electrode 4, the ion source material 5, an accelerating voltage power supply 6, a pulse generator 7 and a power supply 8 for the control electrode. FIGS. 2A-2C show voltage waveforms applied to various parts of the ion source indicated in FIG. 1. FIG. 3 indicates a typical example of ion extracting voltage-current intensity characteristics in the embodiment shown in FIG. 1. The liquid metal ion source is characterized in that there exists a threshold voltage ($V_{th}$) for the ion extraction.

The ion source according to this embodiment works as follows. The accelerating voltage power supply 6 and the pulse generator 7 are connected in series between the ion emitter tip 1 and the extracting electrode 4 and the output voltage of the accelerating voltage power supply 6 is kept, as indicated in FIG. 2A, at a high DC voltage, which is close to the threshold voltage $V_{th}$ of the characteristics of the ion source indicated in FIG. 3 so that the ion beam is maintained in the cut-off state. Further, by making the pulse generator 7 work, a voltage having a desired value, frequency and duty ratio, and a pulsed waveform, as indicated in FIG. 2B, is superposed on the output voltage of the accelerating voltage power supply 6 and thus a voltage indicated in FIG. 2C is applied between the extracting electrode 4 and the ion emitter tip 1 in order to take out a desired pulsed ion beam ($I_e$). In this case, the intensity of the ion beam can be easily varied by changing the amplitude $V_{add}$ of the pulse voltage, the pulse frequency and its duty ratio in the pulse generator 7. Between the ion emitter tip 1 and the extracting electrode 4 is previously applied a voltage, which is close to the threshold voltage $V_{th}$ for ion emission and therefore a low voltage of several tens to several hundreds V is sufficient as the amplitude $V_{add}$ of the pulse voltage necessary for the ion extraction.

To the control electrode 3 a voltage is applied by the power supply 8 for the control electrode. The electric field at the extremity of the ion emitter tip can be controlled also by regulating this voltage applied to the control electrode 3. The voltage applied to the extracting electrode 4, which is necessary for extracting ions from the ion emitter tip 1, that is, the threshold voltage for the ion emission varies, depending on the voltage applied to the control electrode 3.

Figure 5B:
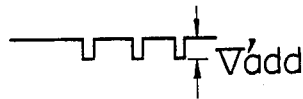
FIG. 5B is a scheme indicating a voltage waveform of the output of the extracting pulsed power supply.
Figure 5C:
FIG. 5C is a scheme indicating a voltage waveform of the output of the post-accelerating voltage power supply.
Figure 6:
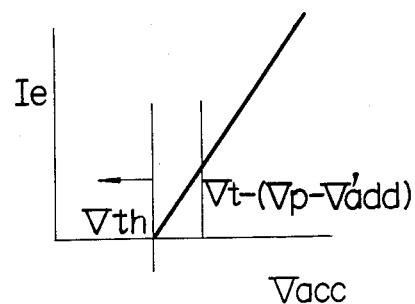
FIG. 6 shows characteristics indicating the relation between the ion accelerating voltage and the intensity of the ion current for the embodiment indicated in FIG. 4.

The second embodiment is an example, by which a DC voltage, which is lower than the threshold voltage of the ion source, is applied to the emitter tip and a pulse voltage having an arbitrary amplitude, an arbitrary frequency and an arbitrary duty cycle is applied to the extracting electrode 4. FIG. 4 illustrates its construction. Since the construction of this embodiment is almost identical to that of the first embodiment, only the items, which are different from those thereof, will be explained. In this embodiment a post-accelerating electrode 11 is disposed in the ion extracting system apart from the extracting electrode 4. To the extracting electrode 4 are connected a post-accelerating voltage power supply 9, which outputs a DC voltage $V_p$ indicated in FIG. 5C, and an extracting pulse generator 10, which outputs a negative pulse voltage $V_{add}$ indicated in FIG. 5B, in series, so that the pulse voltage is superposed on the DC voltage. That is, the potential between the emitter tip and the extracting electrode is equal to $V_t - V_p$. $V_t$ and $V_p$ are so determined that this difference is equal to $V_{th}$. FIG. 6 indicates the dependence of the intensity of the ion current $I_e$ on the extracting voltage and the working voltage for the ion source in this embodiment.

Figure 5A:
FIG. 5A is a scheme indicating a voltage waveform of the output of the accelerating voltage power supply.

The working of the ion source in this embodiment will be described below, referring to FIG. 4. At first a voltage indicated in FIG. 5A is applied between the ion emitter tip 1 and the extracting electrode 4 by the accelerating voltage power supply 6 and the post-accelerating voltage power supply 9, the potential difference $(V_t - V_p)$ of which is lower than the threshold voltage $(V_{th})$ for the ion extraction, so that the beam is in the cut-off state. Then a pulsed beam is extracted by operating the extracting pulse generator 10, so that a negative pulse voltage $-V_{add}$ is superposed on the DC voltage $V_p$, and by applying the voltage thus obtained to the extracting electrode 4.

Concrete numerical examples are as follows. The sorts of used ions were $Ga^+$ and $Cs^+$. In the first embodiment it has been proved that it is possible to extract a stable pulsed beam under the conditions that the threshold voltage for ion extraction $V_{th} = 5$ kV, the amplitude of the superposed pulses $V_{add} = 100$ V, the pulse width $= 10$ $\mu$sec$-1$ msec, and the duty ratio$=1/5-1/10$, and a current density of $3-10$ A/cm$^2$ has been obtained. This value is about 10 times as large as that obtained with a conventional continuous beam. In the second embodiment results similar to those of the first embodiment were obtained under the conditions that the threshold voltage for ion extraction $V_{th} = 7$ kV, the DC voltage applied to the extracting electrode $V_p = 2$ kV (potential difference between the ion emitter tip 1 and the extracting electrode 4 equals to $V_t = V_p = 5$ kV), the amplitude of the superposed pulses $V_{add} = -100$ V, the pulse width $= 10$ $\mu$sec$-1$ msec, and the duty ratio$=1/5-1/10$.

Figure 7:
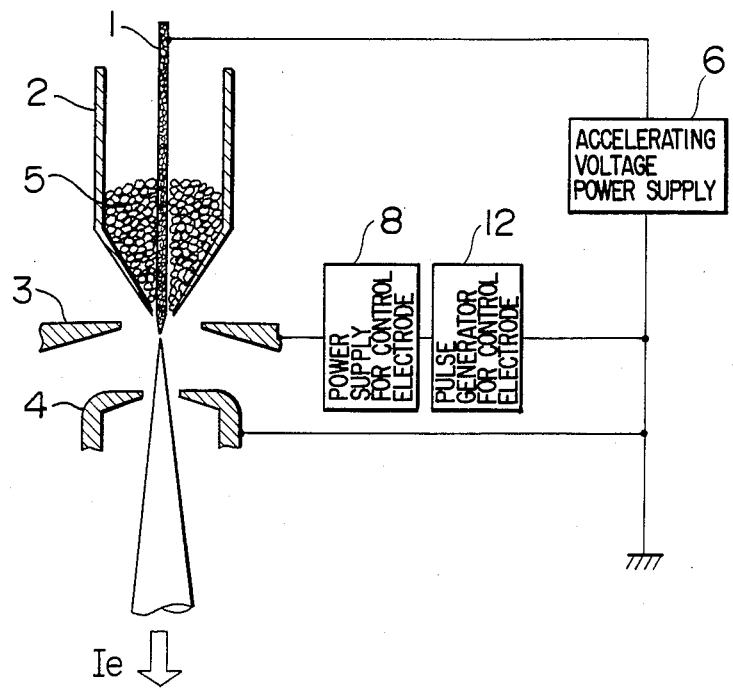
FIG. 7 is a schematical cross-sectional view illustrating the construction of a liquid metal ion source according to a third embodiment of this invention.
Figure 8A:
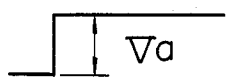
FIG. 8A is a scheme indicating a voltage waveform of the output of the accelerating voltage power supply.
Figure 8B:
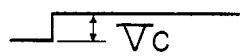
FIG. 8B is a scheme indicating a waveform of the voltage applied to the control electrode.
Figure 8C:
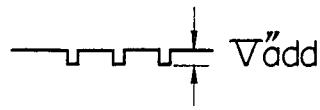
FIG. 8C is a scheme indicating a pulse voltage waveform of the output of the control pulse power supply.

Next pulse beam generation by varying the voltage applied to the control electrode 3 will be explained by using an embodiment indicated in FIG. 7. The strength of the electric field formed at the extremity of the ion emitter tip 1 can be varied also by changing the potential of the control electrode 3, even if the voltage between the ion emitter tip 1 and the extracting electrode 4 is maintained constant. That is, the voltage of the accelerating voltage power supply 6 indicated in FIG. 8A and that of the control electrode power supply 8 indicated in FIG. 8B are so regulated that the potential of the ion emitter tip 1 is at the neighborhood of the threshold voltage for ion emission. In this state the ion beam is cut off. Then, a negative pulse voltage $V''_{add}$ indicated in FIG. 8C is superposed on the DC voltage applied to the control electrode, while operating a pulse generator 12 for the control electrode. In this way the electric field strength at the extremity of the ion emitter tip 1 exceeds the threshold voltage for ion emission and thus a pulsed ion current $I_e$ can be extracted. It is possible to form a pulsed beam by controlling the potential of the control electrode by using a pulsed voltage in such a manner. Experiments of this technique in order to put it to practical use also have been done and it has been proven that it is possible to obtain a pulsed beam well controllable for practical use by this technique.

Hereinbelow the above embodiment will be described.

(1) When a pulsed ion beam is formed by the prior art technique a pulsed voltage of several kV corresponding to the extracting voltage is necessary. To the contrary, according to these embodiments, the voltage for pulsing the beam can be set at a value as low as about 100 V. Consequently it is possible to apply a pulsed voltage having good rising and falling characteristics and to obtain a pulsed beam having so called good rising and falling characteristics. (2) The space charge effect is alleviated and current density is increased 5–10 times with respect to that obtained by the prior art technique.

According to this invention, the following effects can be obtained.

(i) Due to the fact that the current density is increased, secondary signals generated per unit area with respect to the primary excitation is strengthened; the S/N ratio is ameliorated; the sensitivity is increased, when applied to analysis; high density beam irradiation becomes possible, when applied to working; and thus working time is shortened.

(ii) Since the beam is pulse controlled, the beam diameter and the beam intensity can be controlled depending on the purpose by combining appropriately the pulse frequency, the duty ratio and the amplitude of pulses and controlling them. It is, therefore, possible to control beam irradiation dose in microregions, depending on their location.

(iii) Computer control is facilitated by utilizing the pulse control and as a consequence the reliability of the beam control is increased.

(iv) The pulse width can be regulated arbitrarily by combining appropriately the pulse frequency and the duty ratio of pulses and thermal effect on samples can be alleviated so that precision is increased, when applied to working and analysis.

We claim:

1. A liquid metal ion source comprising:
   an ion emitter tip;
   ion source material holder means holding ion source material for supplying liquid metal ion source material to said ion emitter tip;
   ion extracting means for extracting ions from said ion emitter tip; and voltage applying means for applying a voltage between said ion extracting means and said ion emitter tip, said voltage applying means including means providing a DC voltage which is at the neighborhood of the threshold $V_{th}$ for ion beam extraction from said ion emitter tip, and pulsing means for providing a pulse voltage superposed on said DC voltage so as to provide a pulsed voltage applied between said ion extracting means ans said ion emitter tip whereby a pulsed voltage having good rising and falling characteristics and a pulsed ion beam are obtained.

2. A liquid metal ion source according to claim 1, wherein said DC voltage means includes a DC power supply for applying a DC votage to said ion emitter tip, said DC voltage being at the neighborhood of the threshold voltage $V_{th}$ for ion beam extraction from said ion emitter tip, and said pulsing means includes a pulse generator generating a pulse voltage, said pulse generator being connected in series to said DC power supply.

3. A liwuid metal ion source according to claim 1, wherein said ion extracting means comprises an extracting electrode.

4. A liquid metal ion source according to claim 3, further comprising a post-accelerating electrode, said DC voltage means including a DC power supply for applying a DC voltage between said ion emitter tip and said ion extracting electrode, said DC voltage corresponding to a voltage which is at hte neighborhood of the threshold voltage $V_{th}$ for ion beam extraction from said ion emitter tip, said voltage applying means further comprising a post-accelerating voltage power supply for applying a voltage between said extracting electrode and said post-accelerating electrode.

5. A liquid metal ion source comprising:

an ion emitter tip;

ion source material holder means holding ion source material for supplying liquid metal ion source material to said ion emitter tip;

ion extracting means for extracting ions from said ion emitter tip, said ion extracting means including an extracting electrode extracting ions from said ion emitter tip, and a control electrode controlling the electric field strength at the extremity of said ion emitter tip;

voltage applying means including means for applying a voltage between said ion extracting means and said ion emitter tip having a voltage value at the neighborhood of the threshold voltage for ion beam extraction from said ion emitter tip; and pulsing means for applying a pulse voltage to said control electrode, whereby a pulsed voltage having good rising and falling characteristics and a pulsed ion beam are obtained.

* * * * *